United States Patent
Go

(10) Patent No.: US 11,162,187 B2
(45) Date of Patent: Nov. 2, 2021

(54) VAPOR PHASE GROWTH DEVICE, AND EPI WAFER PRODUCING METHOD

(71) Applicant: SUMITOMO ELECTRIC INDUSTRIES, LTD., Osaka (JP)

(72) Inventor: Takashi Go, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 225 days.

(21) Appl. No.: 16/670,305

(22) Filed: Oct. 31, 2019

(65) Prior Publication Data

US 2020/0165744 A1 May 28, 2020

(30) Foreign Application Priority Data

Nov. 28, 2018 (JP) ............... JP2018-221878

(51) Int. Cl.
| | |
|---|---|
| H01L 21/20 | (2006.01) |
| C30B 25/14 | (2006.01) |
| H01L 21/02 | (2006.01) |
| C30B 29/40 | (2006.01) |
| C23C 16/458 | (2006.01) |
| C23C 16/46 | (2006.01) |
| C23C 16/455 | (2006.01) |
| C30B 25/10 | (2006.01) |
| H01L 21/687 | (2006.01) |

(52) U.S. Cl.
CPC ............ *C30B 25/14* (2013.01); *C23C 16/455* (2013.01); *C23C 16/4583* (2013.01); *C23C 16/46* (2013.01); *C30B 25/10* (2013.01); *C30B 29/40* (2013.01); *H01L 21/0262* (2013.01); *H01L 21/02392* (2013.01); *H01L 21/02546* (2013.01); *H01L 21/02549* (2013.01); *H01L 21/68785* (2013.01)

(58) Field of Classification Search
CPC ......... H01L 21/02392; H01L 21/02529; H01L 21/02546; H01L 21/02549; H01L 21/0262; H01L 21/68785; H01L 29/0692; H01L 29/1608; H01L 29/34; C30B 25/00; C30B 25/10; C30B 25/14; C30B 25/20; C30B 29/36; C30B 29/40; C30B 25/186; C23C 16/455; C23C 16/4583; C23C 16/46; C23C 16/325
USPC ...................................... 438/478
See application file for complete search history.

(56) References Cited

U.S. PATENT DOCUMENTS

| | | | |
|---|---|---|---|
| 2015/0162187 A1* | 6/2015 | Miyasaka | ........... H01L 29/0692 257/77 |
| 2016/0024652 A1* | 1/2016 | Ito | .......................... C30B 29/36 427/249.15 |

FOREIGN PATENT DOCUMENTS

JP    H05-97578 A    4/1993

* cited by examiner

*Primary Examiner* — Brook Kebede
(74) *Attorney, Agent, or Firm* — Oliff PLC

(57) ABSTRACT

A vapor phase growth device includes a flow channel defining a space through which a source gas for forming an epi layer flows, a susceptor configured to hold a substrate in a state where the substrate faces the space, and a first member disposed vertically above and opposite to the susceptor, the first member having a thermal expansion coefficient not less than 0.7 times and not more than 1.3 times the thermal expansion coefficient of the substrate. The flow channel includes a holding portion configured to hold the first member.

12 Claims, 5 Drawing Sheets

VAPOR PHASE GROWTH DEVICE, AND EPI WAFER PRODUCING METHOD

CROSS REFERENCE TO RELATED APPLICATIONS

The present disclosure claims priority based on Japanese Patent Application No. 2018-221878 filed on Nov. 28, 2018, the entire contents of which are herein incorporated by reference.

BACKGROUND

The present disclosure relates to a vapor phase growth device and a method for producing an epi wafer.

An epi wafer having an epi layer (semiconductor layer formed by epitaxial growth) formed on a semiconductor substrate can be produced by placing the semiconductor substrate in a flow channel of a vapor phase growth device and by causing a source gas to flow through the flow channel. In such a method of producing an epi wafer using the vapor phase growth device, the semiconductor supposed to form the epi layer would also deposit on and adhere to the inner wall of the flow channel. When such deposits come off from the inner wall of the flow channel and adhere to a surface of the epi layer, they produce defects. For example, when the epi wafer is used to produce a sensor having two-dimensionally arranged pixels, any pixel that suffers such a defect will not function properly.

As a way of suppressing occurrence of such defects due to flaking of the deposits, a technique of suppressing generation of deposits (reaction products) by cooling the flow channel has been proposed (see, for example, Japanese Patent Application Laid-Open No. H5-97578).

SUMMARY

A vapor phase growth device according to the present disclosure is a vapor phase growth device for forming an epi layer made of a single-crystal semiconductor on a substrate made of a single-crystal semiconductor by vapor phase growth. This vapor phase growth device includes: a flow channel defining a space through which a source gas for forming the epi layer flows, a susceptor configured to hold the substrate in a state where the substrate faces the space, and a first member disposed vertically above and opposite to the susceptor, the first member having a thermal expansion coefficient not less than 0.7 times and not more than 1.3 times a thermal expansion coefficient of the substrate. The flow channel includes a holding portion configured to hold the first member.

BRIEF DESCRIPTION OF DRAWINGS

The foregoing and other purposes, aspects and advantages will be better understood from the following detailed description of preferred embodiments of the invention with reference to the drawings, in which.

DESCRIPTION OF EMBODIMENTS

Figure 1:
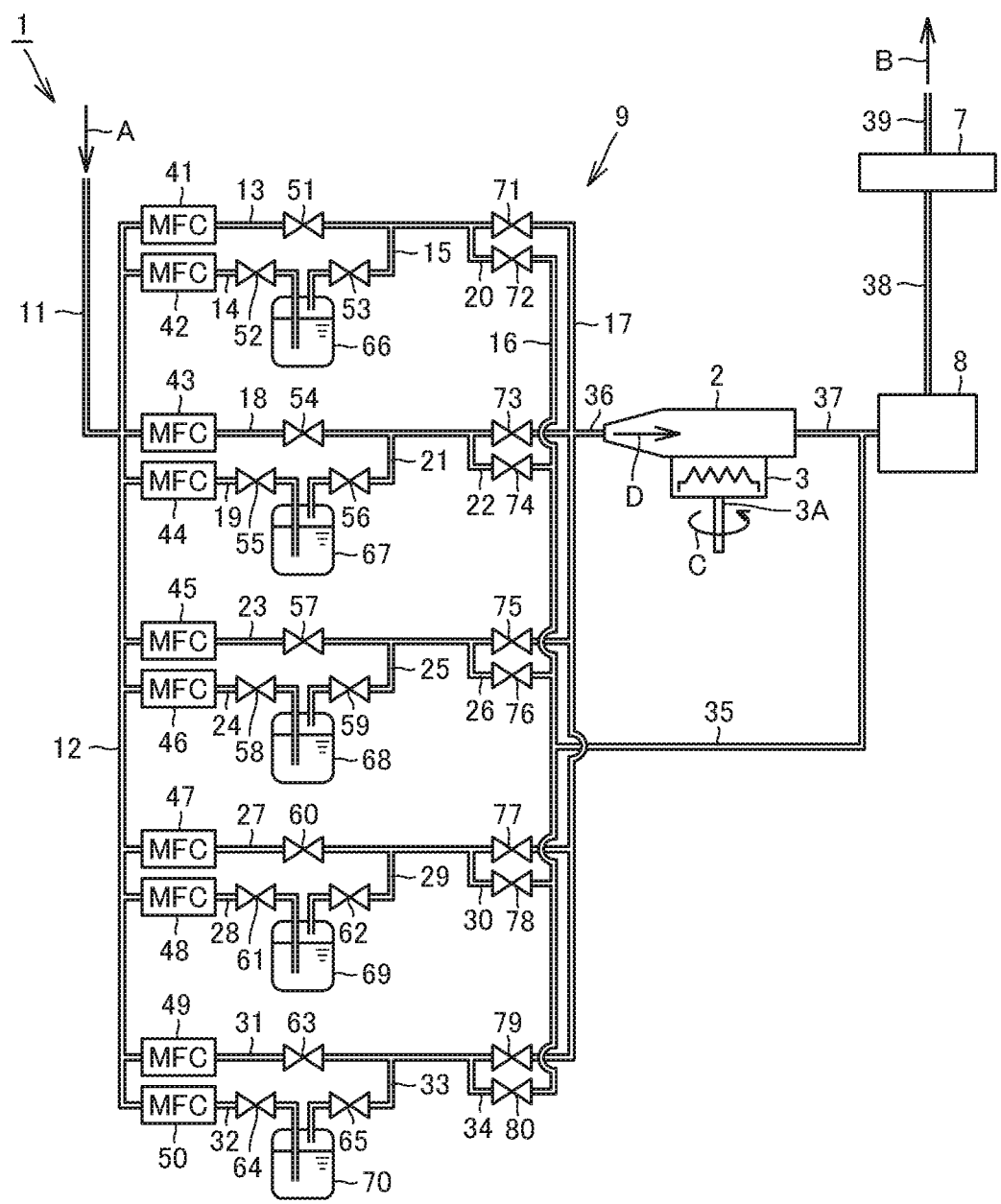
FIG. 1 is a schematic view showing the structure of a vapor phase growth device.

As explained above, in the production of an epi wafer, it is important to suppress defects that are caused by deposits adhering to and then coming off from the inner wall of the flow channel. An object is thus to provide a vapor phase growth device and an epi wafer producing method capable of suppressing the occurrence of defects due to flaking of deposits.

The vapor phase growth device according to the present disclosure can suppress the occurrence of defects due to flaking of the deposits.

Description of Embodiments of the Present Disclosure

Embodiments of the present disclosure will be listed and described first. A vapor phase growth device according to the present disclosure is a vapor phase growth device for forming an epi layer made of a single-crystal semiconductor on a substrate made of a single-crystal semiconductor by vapor phase growth. This vapor phase growth device includes: a flow channel defining a space through which a source gas for forming the epi layer flows, a susceptor configured to hold the substrate in a state where the substrate faces the space, and a first member disposed vertically above and opposite to the susceptor, the first member having a thermal expansion coefficient not less than 0.7 times and not more than 1.3 times a thermal expansion coefficient of the substrate. The flow channel includes a holding portion configured to hold the first member.

Generally, a flow channel is made of quartz ($SiO_2$), for example, in consideration of required heat resistance, cost, and the like. There is often a large difference between the thermal expansion coefficient of quartz and that of a semiconductor forming an epi layer. Thus, during the formation of an epi layer by vapor phase growth, deposits adhere to the inner wall of the flow channel made of quartz. Thereafter, as the flow channel undergoes a temperature change, the deposits come off because of the difference in thermal expansion coefficient. When the deposits that have adhered to a region on the flow channel inner wall surface vertically above and opposing the epi layer on the substrate come off from the wall surface, the deposits will in turn adhere to the surface of the epi layer.

The vapor phase growth device of the present disclosure includes the first member disposed vertically above and opposite to the susceptor. With this, the first member is positioned vertically above the substrate that is held by the susceptor, and opposes the substrate. The thermal expansion coefficient of the first member is not less than 0.7 times and not more than 1.3 times that of the substrate. The thermal expansion coefficient of the semiconductor constituting the substrate is in many cases close to the thermal expansion coefficient of the semiconductor constituting the epi layer formed on the substrate. Thus, even when deposits adhere to the first member located to oppose the substrate, there is only a small difference in thermal expansion coefficient between the first member and the deposits. This suppresses flaking of the deposits and, hence, occurrence of defects caused thereby. Accordingly, the vapor phase growth device of the present disclosure is capable of suppressing the occurrence of defects due to flaking of the deposits. It should be noted that the thermal expansion coefficient in the present disclosure refers to that at a temperature of from room temperature (of 25° C.) to 600° C.

In the vapor phase growth device described above, the flow channel may have a through hole extending from an inner wall surface to an outer wall surface thereof. The holding portion may include a support portion formed on an outer periphery of the through hole. The first member may be supported by the support portion to be positioned to close the through hole. Adopting such a structure in which the through hole is formed in the flow channel and the first member having a shape corresponding to the through hole is supported by the support portion formed on the outer periphery of the through hole facilitates mounting the first member.

In the vapor phase growth device described above, the holding portion may be an adhesive that bonds the first member to an inner wall surface of the flow channel. This enables mounting the first member without heavily modifying the flow channel.

In the vapor phase growth device described above, the first member may be a semiconductor substrate. This facilitates preparation of the first member.

In the vapor phase growth device described above, as observed in a direction perpendicular to a first main surface of the substrate on which the epi layer is to be formed, the first main surface is included in the first member. In the vapor phase growth device described above, assuming an orthogonal projection of a portion of the first member exposed to the above-described source gas-flowing space with respect to a plane including a first main surface of the substrate on which the epi layer is to be formed, the first main surface may be included in the orthogonal projection. With this, the entire area of the first main surface of the substrate opposes the first member. This makes it possible to more reliably suppress the occurrence of defects due to flaking of the deposits.

In the vapor phase growth device described above, the substrate and the first member may be made of a same semiconductor material. This can further reliably suppress the flaking of the deposits. The first member may be a semiconductor substrate made of the same semiconductor material as the substrate.

In the vapor phase growth device described above, the substrate may be made of InP. InP is a suitable material of the substrate for forming the epi wafer.

In the vapor phase growth device described above, the first member may be held by the holding portion in a replaceable manner. This facilitates making the thermal expansion coefficient of the first member close to that of the substrate.

In the vapor phase growth device described above, the flow channel may have an opening extending from an inner wall surface to an outer wall surface thereof. The susceptor may be disposed to close this opening. This facilitates replacement of the substrate held by the susceptor.

An epi wafer producing method according to the present disclosure includes the steps of: preparing a substrate made of a single-crystal semiconductor; and forming an epi layer made of a single-crystal semiconductor on the substrate by vapor phase growth. The epi layer forming step is performed using the vapor phase growth device according to the present disclosure. The epi layer forming step includes a first step of holding the first member by the holding portion, a second step of holding the substrate by the susceptor, and a third step, performed following the first and second steps, of forming the epi layer on the substrate by causing the source gas to flow through the flow channel.

In the epi wafer producing method of the present disclosure, the step of forming an epi layer is performed using the above-described vapor phase growth device of the present disclosure which can suppress the occurrence of defects due to flaking of the deposits. Accordingly, the epi wafer producing method of the present disclosure is capable of suppressing the occurrence of defects due to flaking of the deposits.

Details of Embodiments of the Present Disclosure

Embodiments of the vapor phase growth device and the epi wafer producing method according to the present disclosure will be described below with reference to the drawings. In the drawings below, the same or corresponding elements are denoted by the same reference numerals, and the description thereof will not be repeated.

Embodiment 1

Referring to FIG. 1, a vapor phase growth device 1 in Embodiment 1 is a vapor phase growth device for forming an epi layer made of a single-crystal semiconductor on a substrate made of a single-crystal semiconductor by vapor phase growth. The vapor phase growth device 1 includes a source gas supply unit 9, a flow channel 2, a susceptor 3, a vacuum pump 8, and a detoxifying device 7. In the present embodiment, the vapor phase growth device is a metal organic chemical vapor deposition (MOCVD) device.

The source gas supply unit 9 includes a first container 66, a second container 67, a third container 68, a fourth container 69, and a fifth container 70. In the present embodiment, the first container 66 stores triethylgallium (TEGa) as gallium (Ga) source gas. The second container 67 stores tertiarybutylarsine (TBAs) as arsenic (As) source gas. The third container 68 stores trimethylantimony (TMSb) as antimony (Sb) source gas. The fourth container 69 stores trimethylindium (TMIn) as indium (In) source gas. The fifth container 70 stores tertiarybutylphosphine (TBP) as phosphorus (P) source gas.

The source gas supply unit 9 includes: a pipe 11 connected to a nitrogen gas source and a hydrogen gas source (both not shown) as carrier gas sources, a pipe 12 connected to the pipe 11, a pipe 36 connected to the upstream side of the flow channel 2, a pipe 17 connected to the pipe 36, a pipe 37 connecting the downstream side of the flow channel 2 to the vacuum pump 8, a pipe 38 connecting the vacuum pump 8 to the detoxifying device 7, and a pipe 39 connected to the outlet side of the detoxifying device 7. The source gas supply unit 9 also includes a pipe 35 connected to the pipe 37, and a pipe 16 connected to the pipe 35. The source gas supply unit 9 further includes pipes 13, 18, 23, 27, and 31 that each connect the pipe 12 to the pipe 17.

The source gas supply unit 9 further includes: a pipe 14 connecting the pipe 12 to the first container 66, a pipe 15 connecting the first container 66 to the pipe 13, and a pipe 20 connecting a region of the pipe 13 downstream of its junction with the pipe 15 to the pipe 16. A mass flow controller (MFC) 41 is disposed in the pipe 13 upstream of its junction with the pipe 15. A valve 51 is disposed in the pipe 13 between its junction with the pipe 15 and the position where the MFC 41 is placed. A valve 71 is disposed in the pipe 13 downstream of its junction with the pipe 20. The pipe 20 has a valve 72 disposed therein. The pipe 14 has an MFC 42 disposed therein. A valve 52 is disposed in the pipe 14 downstream of the region in which the MFC 42 is placed. The pipe 15 has a valve 53 disposed therein.

The source gas supply unit 9 further includes: a pipe 19 connecting the pipe 12 to the second container 67, a pipe 21 connecting the second container 67 to the pipe 18, and a pipe 22 connecting a region of the pipe 18 downstream of its junction with the pipe 21 to the pipe 16. An MFC 43 is disposed in the pipe 18 upstream of its junction with the pipe 21. A valve 54 is disposed in the pipe 18 between its junction with the pipe 21 and the position where the MFC 43 is placed. A valve 73 is disposed in the pipe 18 downstream of its junction with the pipe 22. The pipe 22 has a valve 74 disposed therein. The pipe 19 has an MFC 44 disposed therein. A valve 55 is disposed in the pipe 19 downstream of the region in which the MFC 44 is placed. The pipe 21 has a valve 56 disposed therein.

The source gas supply unit 9 further includes: a pipe 24 connecting the pipe 12 to the third container 68, a pipe 25 connecting the third container 68 to the pipe 23, and a pipe 26 connecting a region of the pipe 23 downstream of its junction with the pipe 25 to the pipe 16. An MFC 45 is disposed in the pipe 23 upstream of its junction with the pipe 25. A valve 57 is disposed in the pipe 23 between its junction with the pipe 25 and the position where the MFC 45 is placed. A valve 75 is disposed in the pipe 23 downstream of its junction with the pipe 26. The pipe 26 has a valve 76 disposed therein. The pipe 24 has an MFC 46 disposed therein. A valve 58 is disposed in the pipe 24 downstream of the region in which the MFC 46 is placed. The pipe 25 has a valve 59 disposed therein.

The source gas supply unit 9 further includes: a pipe 28 connecting the pipe 12 to the fourth container 69, a pipe 29 connecting the fourth container 69 to the pipe 27, and a pipe 30 connecting a region of the pipe 27 downstream of its junction with the pipe 29 to the pipe 16. An MFC 47 is disposed in the pipe 27 upstream of its junction with the pipe 29. A valve 60 is disposed in the pipe 27 between its junction with the pipe 29 and the position where the MFC 47 is placed. A valve 77 is disposed in the pipe 27 downstream of its junction with the pipe 30. The pipe 30 has a valve 78 disposed therein. The pipe 28 has an MFC 48 disposed therein. A valve 61 is disposed in the pipe 28 downstream of the region in which the MFC 48 is placed. The pipe 29 has a valve 62 disposed therein.

The source gas supply unit 9 further includes: a pipe 32 connecting the pipe 12 to the fifth container 70, a pipe 33 connecting the fifth container 70 to the pipe 31, and a pipe 34 connecting a region of the pipe 31 downstream of its junction with the pipe 33 to the pipe 16. An MFC 49 is disposed in the pipe 31 upstream of its junction with the pipe 33. A valve 63 is disposed in the pipe 31 between its junction with the pipe 33 and the position where the MFC 49 is placed. A valve 79 is disposed in the pipe 31 downstream of its junction with the pipe 34. The pipe 34 has a valve 80 disposed therein. The pipe 32 has an MFC 50 disposed therein. A valve 64 is disposed in the pipe 32 downstream of the region in which the MFC 50 is placed. The pipe 33 has a valve 65 disposed therein.

Figure 2:
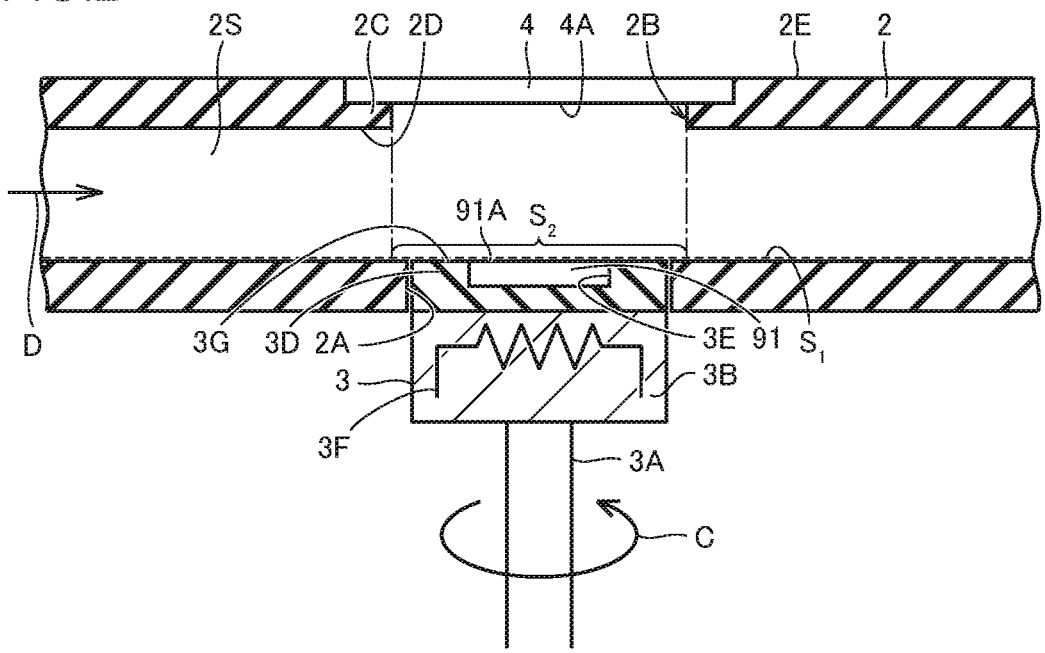
FIG. 2 is a schematic cross-sectional view showing the structure of a flow channel, a susceptor, and their surroundings in Embodiment 1.
Figure 3:
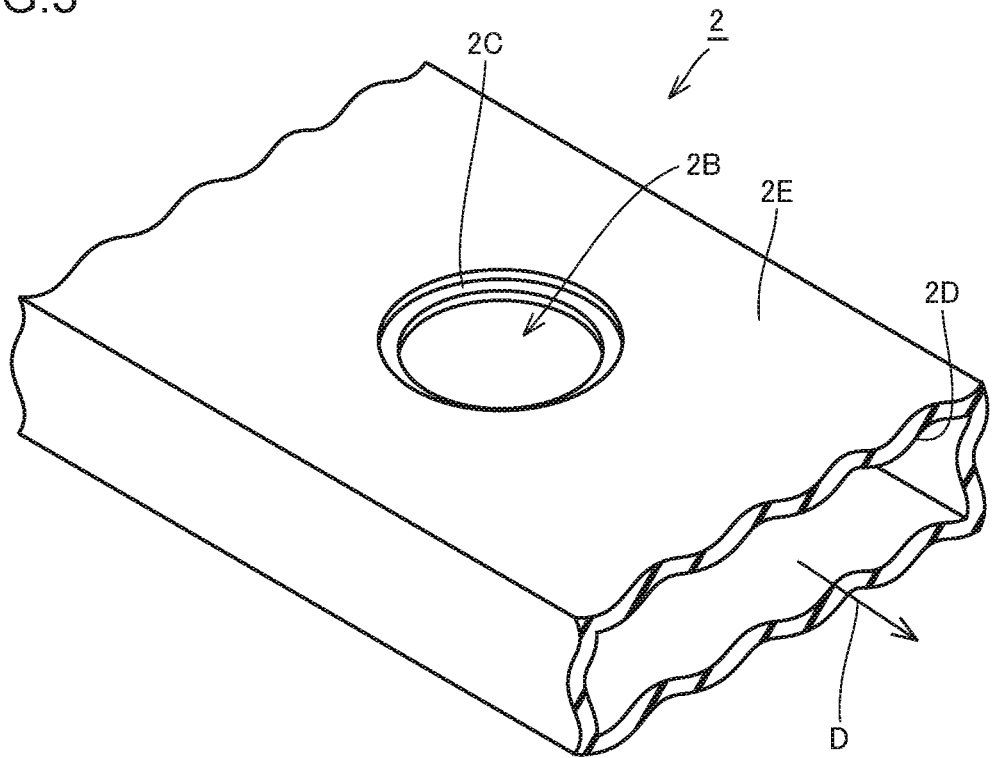
FIG. 3 is a schematic perspective view showing the structure of the flow channel in Embodiment 1.

The structure of the flow channel, the susceptor, and their surroundings will be described in detail below. Referring to FIGS. 1 to 3, the vapor phase growth device 1 in the present embodiment includes the flow channel 2, the susceptor 3, and a first member 4. The flow channel 2 defines a space 2S (hereinafter, sometimes referred to as "source gas-flowing space") through which source gases for forming an epi layer on a substrate flow. The flow channel 2 has an opening 2A extending from its inner wall surface 2D to its outer wall surface 2E, and a holding portion arranged to oppose the opening 2A. In the present embodiment, the holding portion is a support portion 2C formed on an outer periphery of a through hole 2B extending from the inner wall surface 2D to the outer wall surface 2E.

Referring to FIG. 3, the flow channel 2 in the present embodiment surrounds the source gas-flowing space 2S which has a rectangular cross section perpendicular to the direction (along the arrow D) in which source gases for forming an epi layer flow. In the present embodiment, the flow channel 2 is made of quartz. The through hole 2B is formed in a wall that corresponds to one long side of this rectangle, extending from the inner wall surface 2D to the outer wall surface 2E. The through hole 2B has a circular cross section perpendicular to the extending direction. The support portion 2C is a ring-shaped projection that is formed to include the inner wall surface 2D and to project from the outer periphery of the through hole 2B toward the center, thereby reducing the diameter of the through hole 2B. In other words, the through hole 2B has a smaller diameter on the inner wall surface 2D side than on the outer wall surface 2E side. The opening 2A is located opposite to the through hole 2B. The opening 2A is formed on the wall (opposite to the wall where the through hole 2B is formed) that corresponds to the other long side of the source gas-flowing space 2S having the rectangular cross section perpendicular to the flow direction (along the arrow D) of the source gases. The opening 2A has a circular cross section perpendicular to the extending direction. The opening 2A is of a disk shape with its diameter kept constant.

The susceptor 3 includes: a base portion 3B of a disk shape; a main body 3D of a disk shape, arranged on the base portion 3B; and a shaft 3A of a cylindrical shape, connected to the base portion 3B. The base portion 3B, the main body 3D, and the shaft 3A have the common central axis. The shaft 3A is connected to a driving device (not shown) capable of driving the shaft 3A around the central axis (in the direction along the arrow C).

The susceptor 3 is disposed to close the opening 2A of the flow channel 2. The main body 3D of the susceptor 3 has a shape corresponding to the opening 2A of the flow channel 2. More specifically, the main body 3D has a diameter slightly smaller than that of the opening 2A. With this main body 3D inserted in the opening 2A, the opening 2A is closed by the main body 3D. The main body 3D has a disk-shaped recess 3E formed on its end surface 3G opposite to the side contacting the base portion 3B. In this recess 3E, a substrate 91 made of a single-crystal semiconductor is placed. The recess 3E has a shape corresponding to the substrate 91. That is, the recess 3E has a diameter slightly larger than that of the substrate 91. The substrate 91 is placed in the recess 3E such that a first main surface 91A of the substrate 91, on which the epi layer is to be formed, and the end surface 3G of the main body 3D are flush with each other. The susceptor 3 is positioned such that the end surface 3G of the main body 3D is flush with the inner wall surface 2D of the flow channel 2. The base portion 3B has a heater 3F disposed therein as a heating member. In the present embodiment, the substrate 91 is made of single-crystal InP. The susceptor 3 holds the substrate 91 so that the substrate 91 faces the source gas-flowing space 2S.

The first member 4 is held by the support portion 2C serving as the holding portion. The first member 4 is disposed, vertically above the susceptor 3, to oppose the susceptor 3. The first member 4 has a thermal expansion coefficient that is not less than 0.7 times and not more than 1.3 times the thermal expansion coefficient of the substrate 91. The thermal expansion coefficient of the first member 4 is preferably not less than 0.8 times and not more than 1.2 times, or not less than 0.9 times and not more than 1.1 times, or further preferably not less than 0.95 times and not more than 1.05 times the thermal expansion coefficient of the substrate 91. The first member 4 is held by the support portion 2C as the holding portion in a replaceable manner. The first member 4 is placed on the support portion 2C. The first member 4 is supported by the support portion 2C so as to close the through hole 2B. In the present embodiment, the first member 4 is of a disk shape. The first member 4 has a diameter greater than an inner diameter of the region of the through hole 2B where the support portion 2C is formed and slightly smaller than an inner diameter of the region of the through hole 2B where no support portion 2C is formed. This facilitates placement and replacement of the first member 4 with respect to the flow channel 2.

In the present embodiment, the first member 4 is a semiconductor substrate. The substrate 91 and the first member 4 may be made of a same semiconductor material. That is, the first member 4 may be an InP substrate. InP forming the first member 4 may be polycrystalline or single-crystalline. Referring to FIG. 2, assuming an orthogonal projection $S_2$ of a portion of the first member 4 exposed to the interior of the flow channel 2 (i.e. the portion exposed to the space 2S through which the source gases flow) with respect to a plane $S_1$ including the first main surface 91A of the substrate 91, the first main surface 91A is included in the orthogonal projection $S_2$. The first member 4 may have a diameter that is at least two times the diameter of the substrate 91. For example, when the substrate 91 has a diameter of 2 inches, the first member 4 may have a diameter of 4 inches.

Figure 4:
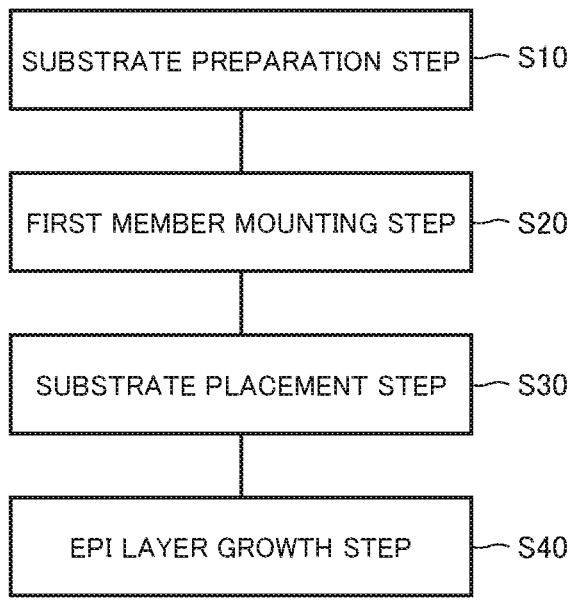
FIG. 4 is a flowchart schematically illustrating a method for producing an epi wafer.
Figure 5:
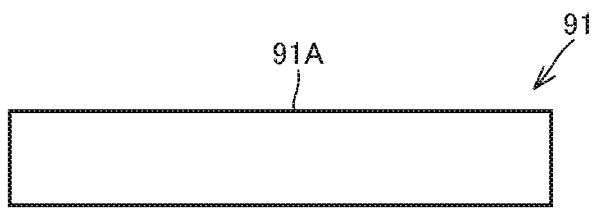
FIGS. 5 and 6 are schematic cross-sectional views illustrating the epi wafer producing method.

A method for producing an epi wafer using the vapor phase growth device 1 in the present embodiment will be described below. Referring to FIG. 4, in the epi wafer producing method in the present embodiment, firstly, a substrate preparation step is performed as a step S10. In this step S10, referring to FIG. 5, a substrate 91 made of InP, having a diameter of 2 inches (50.8 mm), for example, is prepared. More specifically, an ingot made of InP is sliced to obtain the InP substrate 91. A first main surface 91A of this substrate 91 is polished, and then subjected to cleaning and other processes, whereby the substrate 91 having the first main surface 91A with its flatness and cleanliness ensured is prepared.

Subsequently, a step of forming an epi layer of a single-crystal semiconductor on the first main surface 91A of the substrate 91 by vapor phase growth is performed. This epi layer formation step is performed using the above-described vapor phase growth device 1. The epi layer formation step includes steps S20 to S40. Firstly, a first member mounting step (first step) is performed as the step S20. In this step S20, referring to FIGS. 2 and 3, a first member 4 having a thermal expansion coefficient that is not less than 0.7 times and not more than 1.3 times the thermal expansion coefficient of the substrate 91 is held by the support portion 2C as the holding portion. Specifically, a single-crystal InP substrate having a diameter of 4 inches, for example, is selected as the first member 4 and placed on the support portion 2C.

Next, a substrate placement step (second step) is performed as the step S30. In this step S30, the substrate 91 made of single-crystal InP, prepared in the step S10, is placed in the recess 3E formed in the main body 3D of the susceptor 3.

Figure 6:
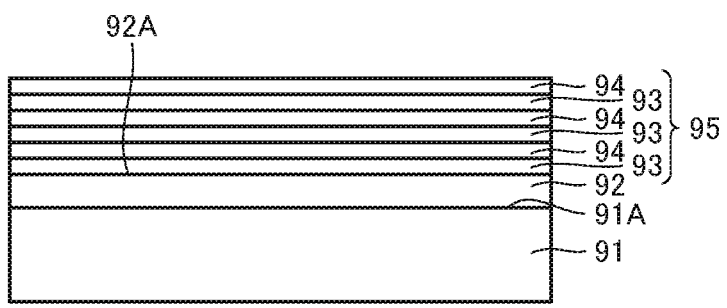

Next, an epi layer growth step (third step) is performed as the step S40. In this step S40, referring to FIGS. 5 and 6, a buffer layer 92 is firstly formed on the first main surface 91A of the substrate 91. Next, a quantum well structure 95 is formed on a second main surface 92A which is a main surface of the buffer layer 92 on the side opposite to the substrate 91. The quantum well structure 95 has a structure in which first element layers 93 and second element layers 94 are stacked alternately. In the present embodiment, the buffer layer 92 is made of InGaAs. The first element layer 93 is made of GaAsSb. The second element layer 94 is made of InGaAs. The buffer layer 92 and the quantum well structure 95 correspond to the epi layers formed on the substrate 91 by epitaxial growth. In the present embodiment, a ratio of the lattice constant of the semiconductors forming the epi layers to the lattice constant of the semiconductor forming the substrate 91 is not less than 0.995 and not more than 1.005. That is, the epi layers in the present embodiment are semiconductor layers formed on the substrate 91 by epitaxial growth. The epi layers can be grown in a temperature range of about 500° C., for example.

In this step S40, source gases for the epi layers are caused to flow in the flow channel 2 (in the space 2S) in which the first member 4 is held on the support portion 2C, whereby the epi layers are formed on the first main surface 91A of the substrate 91 held by the susceptor 3. More specifically, appropriate source gases are supplied from the source gas supply unit 9 into the flow channel 2, so that the buffer layer 92 and the quantum well structure 95 grow on the first main surface 91A of the substrate 91.

Referring to FIG. 1, firstly, nitrogen gas and hydrogen gas serving as the carrier gases are supplied from a carrier gas source (not shown) to the pipe 11, along the arrow A. The nitrogen gas and hydrogen gas reach the pipe 12 connected to the pipe 11. Source gases stored in the first to fifth containers 66 to 70 are introduced into the flow channel 2, along the arrow D, as the valves disposed in the pipes communicating respectively with the first to fifth containers 66 to 70 are opened and closed as appropriate.

For introducing Ga source gas into the flow channel 2, the valves 52, 53, and 71 are opened. With this, the Ga source gas, TEGa, stored in the first container 66 is carried by the carrier gases through the pipes 17 and 36, and introduced into the flow channel 2. The amount of TEGa supplied to the flow channel 2 can be adjusted by the MFCs 41 and 42.

For introducing As source gas into the flow channel 2, the valves 55, 56, and 73 are opened. With this, the As source gas, TBAs, stored in the second container 67 is carried by the carrier gases through the pipe 36, and introduced into the flow channel 2. The amount of TBAs supplied to the flow channel 2 can be adjusted by the MFCs 43 and 44.

For introducing Sb source gas into the flow channel 2, the valves 58, 59, and 75 are opened. With this, the Sb source gas, TMSb, stored in the third container 68 is carried by the carrier gases through the pipes 17 and 36, and introduced into the flow channel 2. The amount of TMSb supplied to the flow channel 2 can be adjusted by the MFCs 45 and 46.

For introducing In source gas into the flow channel 2, the valves 61, 62, and 77 are opened. With this, the In source gas, TMIn, stored in the fourth container 69 is carried by the carrier gases through the pipes 17 and 36, and introduced into the flow channel 2. The amount of TMIn supplied to the flow channel 2 can be adjusted by the MFCs 47 and 48.

For introducing P source gas into the flow channel 2, the valves 64, 65, and 79 are opened. With this, the P source gas, TBP, stored in the fifth container 70 is carried by the carrier gases through the pipes 17 and 36, and introduced into the flow channel 2. The amount of TBP supplied to the flow channel 2 can be adjusted by the MFCs 49 and 50.

The interior of the flow channel 2 is maintained at an appropriate pressure by the vacuum pump 8 connected to the flow channel 2 via the pipe 37. The source gases and the carrier gases that have passed through the flow channel 2 are sent to the detoxifying device 7 via the pipe 38 connected to the vacuum pump 8. The gases that have been made harmless by the detoxifying device 7 are discharged through the pipe 39 to the outside, along the arrow B.

Referring to FIG. 2, the susceptor 3 is heated by the heater 3F. This allows the substrate 91 to be maintained at an appropriate temperature. The shaft 3A is driven by a driving device (not shown) to rotate about the central axis. This allows the substrate 91 to rotate in the circumferential direction. In this state, the source gases are introduced into the flow channel 2, along the arrow D, so that the buffer layer 92 and the quantum well structure 95, which are the epi layers, are formed on the first main surface 91A of the substrate 91. With the necessary source gases introduced into the flow channel 2 as explained above, the epi layers are formed continuously.

Here, referring to FIG. 2, the susceptor 3 is heated by the heater 3F during the formation of the epi layers. The radiant heat from the susceptor 3 or the like heats a region opposing the susceptor 3, so deposits of the semiconductors supposed to form the epi layers would likely adhere to that region. When there is a large difference in thermal expansion coefficient between the deposits and the region where the deposits have adhered, the deposits will come off during the cooling process following the epitaxial growth, and may drop onto the surface of the epi layer formed on the substrate 91. However, in the epi wafer producing method using the vapor phase growth device 1 in the present embodiment, the region opposing the substrate 91 is a surface 4A of the first member 4. The first member 4 has a thermal expansion coefficient not less than 0.7 times and not more than 1.3 times the thermal expansion coefficient of the substrate 91. In the present embodiment, the first member 4 is made of InP which is the same material as the substrate 91. Thus, even though deposits may adhere to the surface 4A of the first member 4, the deposits would not likely come off. In other words, the first member 4 serves as a member that prevents falling of the deposits. As a result, in the epi wafer producing method using the vapor phase growth device 1 in the present embodiment, the occurrence of defects due to flaking of the deposits is suppressed.

Embodiment 2

Embodiment 2 as another embodiment of the present disclosure will be described below. A vapor phase growth device 1 in Embodiment 2 basically has a similar structure as and produces similar effects as that in Embodiment 1. The vapor phase growth device 1 in Embodiment 2 differs from that of Embodiment 1 in terms of the shape of the support portion 2C.

Figure 7:
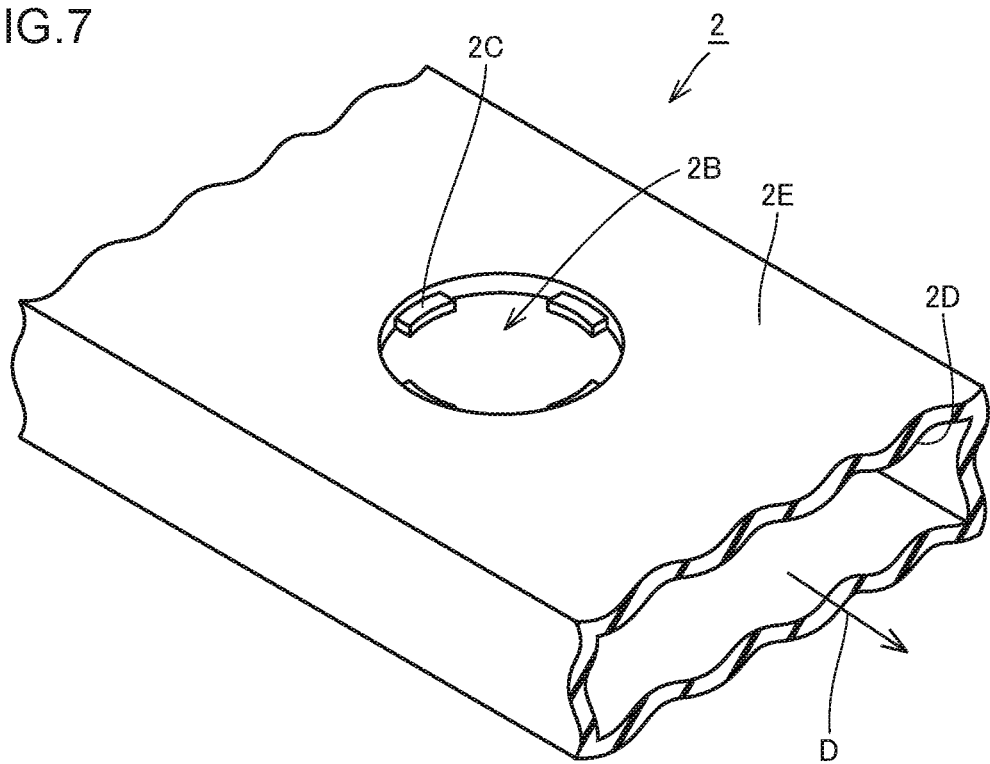
FIG. 7 is a schematic perspective view showing the structure of a flow channel in Embodiment 2.

Referring to FIGS. 7 and 3, a support portion 2C in the flow channel 2 in Embodiment 2 has, not the ring shape as in Embodiment 1, but an arc shape. A plurality of support portions 2C are arranged along the outer periphery of the through hole 2B. In the present embodiment, four arc-shaped support portions 2C are arranged at equal intervals along the outer periphery of the through hole 2B. Embodiment 2 adopting such a structure can also produce similar effects as in Embodiment 1 above.

Embodiment 3

Embodiment 3 as yet another embodiment of the present disclosure will be described below. A vapor phase growth device 1 in Embodiment 3 basically has a similar structure as and produces similar effects as that in Embodiment 1. The vapor phase growth device 1 in Embodiment 3 differs from that of Embodiment 1 in terms of the structure of the holding portion.

Figure 8:
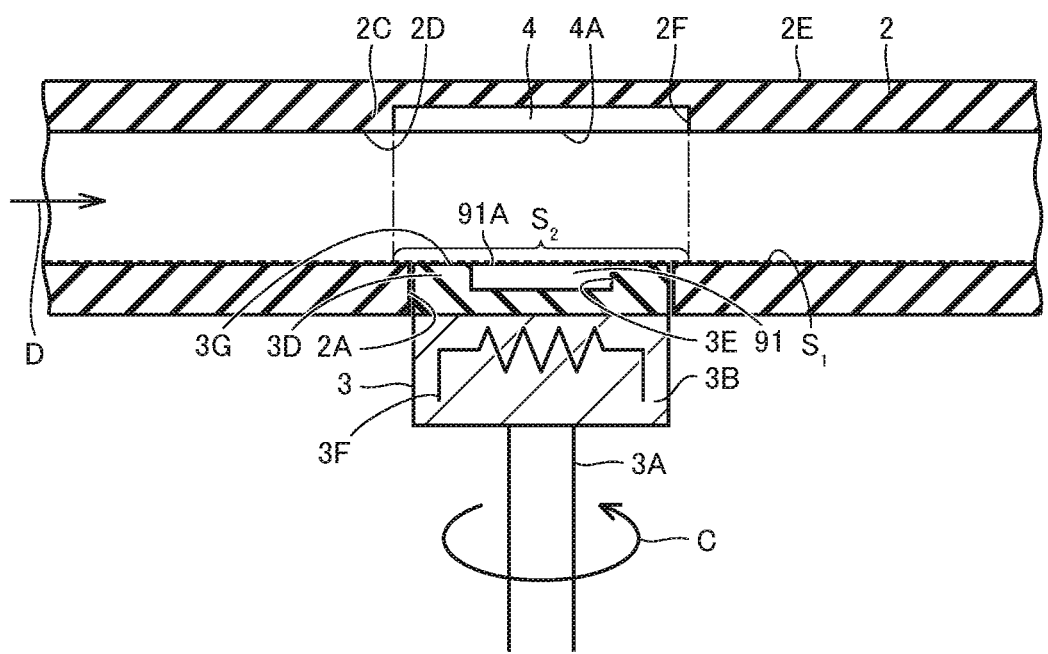
FIG. 8 is a schematic cross-sectional view showing the structure of a flow channel, a susceptor, and their surroundings in Embodiment 3.

Referring to FIGS. 8 and 2, the holding portion in Embodiment 3 is not the support portion 2C formed on the outer periphery of the through hole 2B as in Embodiment 1, but a recess 2F formed in the inner wall surface of the flow channel 2. The recess 2F has a disk shape corresponding to the first member 4. As a result, the surface 4A of the first member 4 and the inner wall surface 2D of the flow channel 2 are flush with each other. This produces an additional effect of suppressing turbulence of airflow of the source gases that is caused by the first member 4 mounted. The first member 4 is held fitted in the recess 2F, for example. The manner of holding the first member 4, however, is not limited thereto. For example, the first member 4 may be held screwed into the recess 2F. Specifically, the first member 4 may have a helical groove formed on the outer peripheral surface, and the corresponding helical groove may be formed on the inner wall surface 2D of the flow channel 2 surrounding the recess 2F.

Embodiment 4

Embodiment 4 as yet another embodiment of the present disclosure will be described below. A vapor phase growth device 1 in Embodiment 4 basically has a similar structure as and produces similar effects as that in Embodiment 1. The vapor phase growth device 1 in Embodiment 4 differs from that of Embodiment 1 in terms of the structure of the holding portion.

Figure 9:
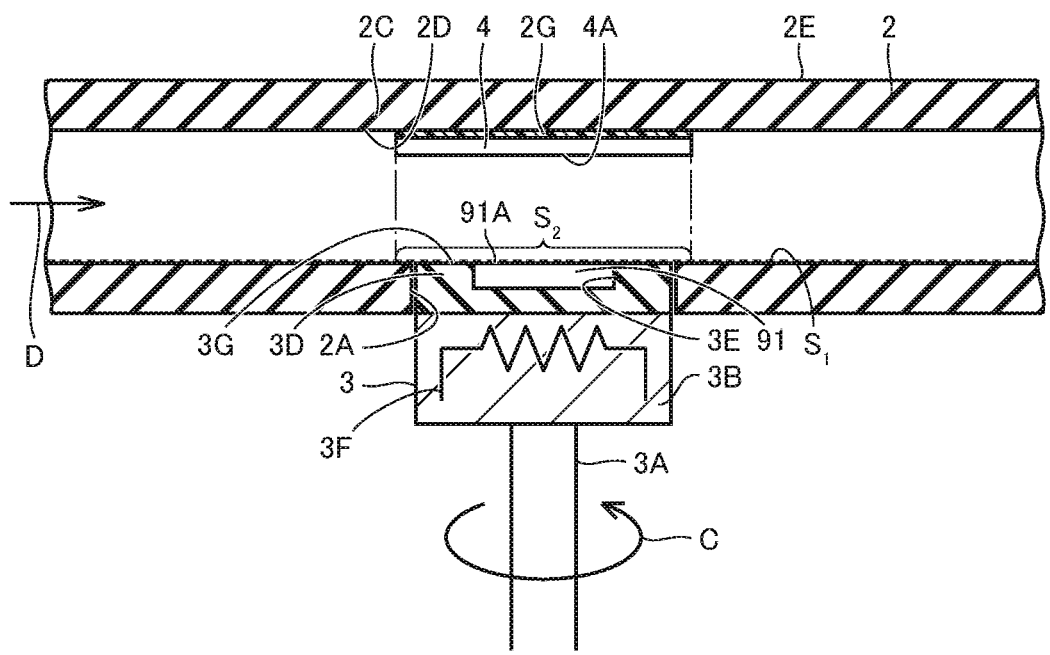
FIG. 9 is a schematic cross-sectional view showing the structure of a flow channel, a susceptor, and their surroundings in Embodiment 4.

Referring to FIGS. 9 and 2, the first member 4 in Embodiment 4 is held attached to the inner wall surface 2D of the flow channel 2 by an adhesive 2G That is, the holding portion in Embodiment 4 is the adhesive 2G that bonds the first member 4 to the inner wall surface 2D of the flow channel 2. This enables mounting the first member 4 without heavily modifying the flow channel 2. The adhesive 2G may be a heat-resistant inorganic adhesive, for example.

In the embodiments described above, the flow channel 2 had an opening 2A, and the susceptor 3 was disposed to close the opening 2A. The opening 2A, however, is not a required configuration for the vapor phase growth device of the present disclosure. For example, the susceptor 3 may be placed in the source gas-flowing space 2S defined by the flow channel 2, with no opening 2A provided in the flow channel 2.

It should be understood that the embodiments disclosed herein are illustrative and non-restrictive in every respect. The scope of the present invention is defined by the terms of the claims, rather than by the foregoing description, and is intended to include any modifications within the scope and meaning equivalent to the terms of the claims.

What is claimed is:

1. A vapor phase growth device for forming an epi layer made of a single-crystal semiconductor on a substrate made of a single-crystal semiconductor by vapor phase growth, comprising:
   a flow channel defining a space through which a source gas for forming the epi layer flows;
   a susceptor configured to hold the substrate in a state where the substrate faces the space; and a first member disposed vertically above and opposite to the susceptor, the first member having a thermal expansion coefficient not less than 0.7 times and not more than 1.3 times a thermal expansion coefficient of the substrate;

the flow channel including a holding portion configured to hold the first member.

2. The vapor phase growth device according to claim 1, wherein the flow channel has a through hole extending from an inner wall surface to an outer wall surface thereof, the holding portion includes a support portion formed on an outer periphery of the through hole, and the first member is supported by the support portion to be positioned to close the through hole.

3. The vapor phase growth device according to claim 1, wherein the holding portion is an adhesive that bonds the first member to an inner wall surface of the flow channel.

4. The vapor phase growth device according to claim 1, wherein the first member is a semiconductor substrate.

5. The vapor phase growth device according to claim 1, wherein, as observed in a direction perpendicular to a first main surface of the substrate on which the epi layer is to be formed, the first main surface is included in the first member.

6. The vapor phase growth device according to claim 1, wherein the substrate and the first member are made of a same semiconductor material.

7. The vapor phase growth device according to claim 1, wherein the substrate is made of InP.

8. The vapor phase growth device according to claim 1, wherein the first member is held by the holding portion in a replaceable manner.

9. The vapor phase growth device according to claim 1, wherein the flow channel has an opening extending from an inner wall surface to an outer wall surface thereof, and the susceptor is disposed to close the opening.

10. A vapor phase growth device for forming an epi layer made of a single-crystal semiconductor on a substrate made of a single-crystal semiconductor by vapor phase growth, comprising:

a flow channel defining a space through which a source gas for forming the epi layer flows;

a susceptor configured to hold the substrate in a state where the substrate faces the space; and a first member disposed vertically above and opposite to the susceptor, the first member having a thermal expansion coefficient not less than 0.7 times and not more than 1.3 times a thermal expansion coefficient of the substrate;

the flow channel including a holding portion configured to hold the first member, the flow channel having a through hole extending from an inner wall surface to an outer wall surface thereof, the holding portion including a support portion formed on an outer periphery of the through hole, the first member being supported by the support portion to be positioned to close the through hole, the first member being a semiconductor substrate, the substrate and the first member being made of a same semiconductor material.

11. The vapor phase growth device according to claim 10, wherein, as observed in a direction perpendicular to a first main surface of the substrate on which the epi layer is to be formed, the first main surface is included in the first member.

12. A method for producing an epi wafer, comprising the steps of:

preparing a substrate made of a single-crystal semiconductor; and forming an epi layer made of a single-crystal semiconductor on the substrate by vapor phase growth;

the step of forming the epi layer being performed using the vapor phase growth device according to claim 1, the step of forming the epi layer including a first step of holding the first member by the holding portion, a second step of holding the substrate by the susceptor, and a third step, performed following the first and second steps, of forming the epi layer on the substrate by causing the source gas to flow in the flow channel.

* * * * *